(12) United States Patent
Aya

(10) Patent No.: US 10,043,635 B2
(45) Date of Patent: Aug. 7, 2018

(54) ION IMPLANTATION APPARATUS

(71) Applicant: Mitsubishi Electric Corporation, Tokyo (JP)

(72) Inventor: Sunao Aya, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/320,104

(22) PCT Filed: Sep. 25, 2014

(86) PCT No.: PCT/JP2014/075454
§ 371 (c)(1),
(2) Date: Dec. 19, 2016

(87) PCT Pub. No.: WO2016/046939
PCT Pub. Date: Mar. 31, 2016

(65) Prior Publication Data
US 2017/0133201 A1    May 11, 2017

(51) Int. Cl.
*H01J 37/317* (2006.01)
*H01J 37/18* (2006.01)
*H01J 37/08* (2006.01)

(52) U.S. Cl.
CPC .......... *H01J 37/3171* (2013.01); *H01J 37/08* (2013.01); *H01J 37/18* (2013.01); *H01J 2237/08* (2013.01)

(58) Field of Classification Search
None
See application file for complete search history.

(56) References Cited

U.S. PATENT DOCUMENTS

| 4,393,333 A * | 7/1983 | Sakudo | H01J 37/08 250/396 ML |
| 5,138,973 A * | 8/1992 | Davis | C23C 16/482 118/719 |

(Continued)

FOREIGN PATENT DOCUMENTS

| JP | S64-10946 U1 | 1/1989 |
| JP | 01-095454 A | 4/1989 |

(Continued)

OTHER PUBLICATIONS

Notification of Transmittal of Translation of the International Preliminary Report on Patentability (Chapter I) and Translation of Written Opinion of the International Searching Authority; PCT/JP2014/075454; dated Apr. 6, 2017.

(Continued)

*Primary Examiner* — Andrew Smyth
(74) *Attorney, Agent, or Firm* — Studebaker & Brackett PC

(57) ABSTRACT

A vacuum is maintained inside a vacuum partition (1). The whole of the solid packed container (3) is disposed inside the vacuum partition (1). A heater (7) sublimates the aluminum chloride (8) packed in the solid packed container (3) to generate an aluminum chloride gas (9). An arc chamber (6) ionizes the aluminum chloride gas (9) and emits an ion beam (11) of the ionized aluminum chloride gas (9). A gas supply nozzle (10) leads the aluminum chloride gas (9) from the solid packed container (3) into the arc chamber (6). A supporting part (4) supports and fixes the solid packed container (3) on the vacuum partition (1). A thermal conductivity of the supporting part (4) is lower than thermal conductivities of the vacuum partition (1) and the solid packed container (3).

8 Claims, 2 Drawing Sheets

(56) References Cited

U.S. PATENT DOCUMENTS

| | | | | |
|---|---|---|---|---|
| 5,306,921 | A * | 4/1994 | Tanaka | H01J 37/08 250/423 R |
| 6,237,529 | B1 * | 5/2001 | Spahn | C23C 14/243 118/723 VE |
| 6,432,256 | B1 * | 8/2002 | Raoux | C04B 41/009 118/715 |
| 8,367,531 | B1 * | 2/2013 | Omarjee | H01J 37/3171 438/513 |
| 9,607,719 | B2 * | 3/2017 | VanDrie | G21B 1/052 |
| 2004/0007678 | A1 * | 1/2004 | Ferrara | H01J 37/3171 250/492.21 |
| 2004/0021092 | A1 * | 2/2004 | Ferrara | H01J 37/20 250/491.1 |
| 2006/0086376 | A1 * | 4/2006 | Dimeo, Jr. | C23C 14/564 134/22.1 |
| 2006/0183625 | A1 * | 8/2006 | Miyahara | C04B 35/053 501/98.4 |
| 2006/0267503 | A1 * | 11/2006 | Bystriskii | G21B 1/052 315/111.21 |
| 2006/0267504 | A1 * | 11/2006 | VanDrie | G21B 1/052 315/111.41 |
| 2008/0230180 | A1 * | 9/2008 | Yoneda | H01L 21/324 156/345.51 |
| 2009/0274256 | A1 * | 11/2009 | Lipinski | G21B 1/19 376/151 |
| 2010/0051825 | A1 * | 3/2010 | Yamashita | H01J 27/14 250/423 R |
| 2010/0154835 | A1 * | 6/2010 | Dimeo | C23C 14/564 134/31 |
| 2011/0240877 | A1 * | 10/2011 | Benveniste | H01J 37/08 250/424 |
| 2012/0241648 | A1 * | 9/2012 | Krampert | F16J 15/064 250/492.21 |

FOREIGN PATENT DOCUMENTS

| | | |
|---|---|---|
| JP | 07-326313 A | 12/1995 |
| JP | 08-222166 A | 8/1996 |
| JP | 2001-011607 A | 1/2001 |
| JP | 2001-262320 A | 9/2001 |
| JP | 2001-291589 A | 10/2001 |

OTHER PUBLICATIONS

International Search Report issued in PCT/JP2014/075454; dated Nov. 25, 2014.

JP Office Action dated Jul. 18, 2017, from corresponding JP Appl No. 2016-549842, with partial English translation, 8 pp.

An Office Action mailed by the State Intellectual Property Office of the People's Republic of China dated Mar. 27, 2018, which corresponds to Chinese Patent Application No. 201480082170.7 and is related to U.S. Appl. No. 15/320,104.

* cited by examiner

ION IMPLANTATION APPARATUS

FIELD

The present invention relates to an ion implantation apparatus which generates a source gas by sublimating a solid-state material, ionizes the source gas and emits an ion beam of the ionized source gas.

BACKGROUND

In an ion implantation apparatus, a source gas is generated by sublimating a solid-state material packed in a solid packed container in a vaporizer, and an arc chamber ionizes the source gas and emits an ion beam of the ionized source gas (see, for example, PTL 1).

CITATION LIST

Patent Literature

PTL 1: JP 7-326313 A

SUMMARY

Technical Problem

As gas supply to the arc chamber, nitrogen is supplied from a nitrogen cylinder (not shown) installed in an external cylinder box (not shown), or a source gas generated with a vaporizer is supplied. When the gas supply from the nitrogen cylinder is changed to the gas supply from the vaporizer, a time for stabilizing sublimation temperature of the vaporizer is required. In particular, a temperature at which aluminum chloride to be used as a solid-state material in an ion implantation apparatus for SiC semiconductor device is sublimated in a vacuum is as low as 80 to 90° C. In the conventional apparatus, however, the solid packed container also serves as a vacuum partition and needs strength. The solid packed container therefore has a shape with an increased wall thickness and has a large heat capacity. There is, therefore, a problem that a long time is taken to complete warm up stabilization and the rate of operation is reduced.

The present invention has been achieved to solve the above-described problem, and an object of the present invention is to provide an ion implantation apparatus capable of reducing the sublimation temperature stabilization time and improving the rate of operation.

Solution to Problem

An ion implantation apparatus according to the present invention includes: a vacuum partition inside which a vacuum is maintained; a solid packed container in which a solid-state material is packed; a heater sublimating the solid-state material packed in the solid packed container to generate a source gas; an arc chamber ionizing the source gas and emitting an ion beam of the ionized source gas; a gas supply nozzle leading the source gas from the solid packed container into the arc chamber; and a supporting part supporting and fixing the solid packed container on the vacuum partition, wherein the whole of the solid packed container is disposed inside the vacuum partition, and a thermal conductivity of the supporting part is lower than thermal conductivities of the vacuum partition and the solid packed container.

Advantageous Effects of Invention

In the present invention, the solid packed container need not have a pressure partition function and may only have a strength necessary for packing of a solid, since the whole of the solid packed container is disposed in the vacuum inside the vacuum partition. The wall thickness of the solid packed container can therefore be reduced to reduce the heat capacity. The amount of heating necessary for sublimation is reduced thereby and a smaller heater suffices. Also, since the solid packed container is supported and fixed on the vacuum partition, the gas supply nozzle need not have the function of supporting the solid packed container. The wall thickness of the gas supply nozzle can therefore be reduced and the inflow of heat from the arc chamber into the solid packed container can be reduced. Further, since the thermal conductivity of the supporting part is lower than those of the vacuum partition and the solid packed container, the amount of heat escaping from the solid packed container through the supporting part can also be reduced. As a result, the time taken to stabilize a sublimation temperature in a range of sublimation temperatures is reduced, thus enabling the state of the ion beam to be stabilized faster and increasing the rate of operation.

DESCRIPTION OF EMBODIMENTS

An ion implantation apparatus according to the embodiments of the present invention will be described with reference to the drawings. The same components will be denoted by the same symbols, and the repeated description thereof may be omitted.

Embodiment 1

Figure 1:
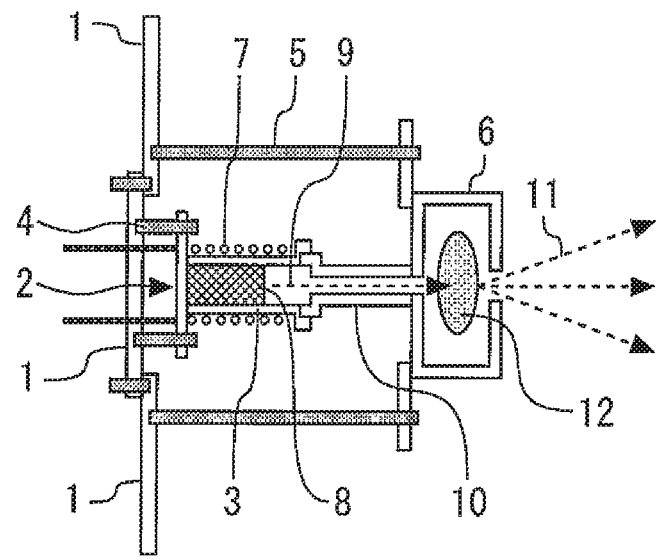
FIG. 1 is a sectional view of an ion injection apparatus according to Embodiment 1 of the present invention.

FIG. 1 is a sectional view of an ion injection apparatus according to Embodiment 1 of the present invention. This apparatus is an SiC semiconductor ion implantation apparatus which implants aluminum ions in an SiC wafer (not shown).

A vacuum is maintained inside a vacuum partition 1 of the ion implantation apparatus. The whole of a solid packed container 3 of a vaporizer 2 is disposed inside the vacuum partition 1. A supporting part 4 supports and fixes the solid packed container 3 on the vacuum partition 1. The thermal conductivity of the supporting part 4 is lower than those of the vacuum partition 1 and the solid packed container 3. A supporting member 5 supports and fixes an arc chamber 6 on the vacuum partition 1.

A heater 7 of the vaporizer 2 sublimates aluminum chloride 8 packed in the solid packed container 3 to generate aluminum chloride gas 9. A gas supply nozzle 10 leads the aluminum chloride gas 9 from the solid packed container 3 into the arc chamber 6. An inlet tube (not shown) for introducing a source gas such as nitrogen is also connected to the arc chamber 6. If the arc chamber 6 is thin, a connection part (not shown) may be provided to connect the gas supply nozzle 10 and the arc chamber 6 to each other.

The arc chamber 6 ionizes the aluminum chloride gas 9 and emits an ion beam 11 of the ionized aluminum chloride gas 9. More specifically, the aluminum chloride gas 9 collides against electrons in the arc chamber 6 to become plasma 12, thus ionizing. The ions are extracted as the ion beam 11 with an extraction electrode (not shown). Then the desired ions are selected by a mass spectrograph (not shown), and the selected ions are accelerated with an acceleration electrode (not shown). The ions are uniformly implanted in a wafer (not shown) by performing scanning with the ion beam 11.

Figure 2:
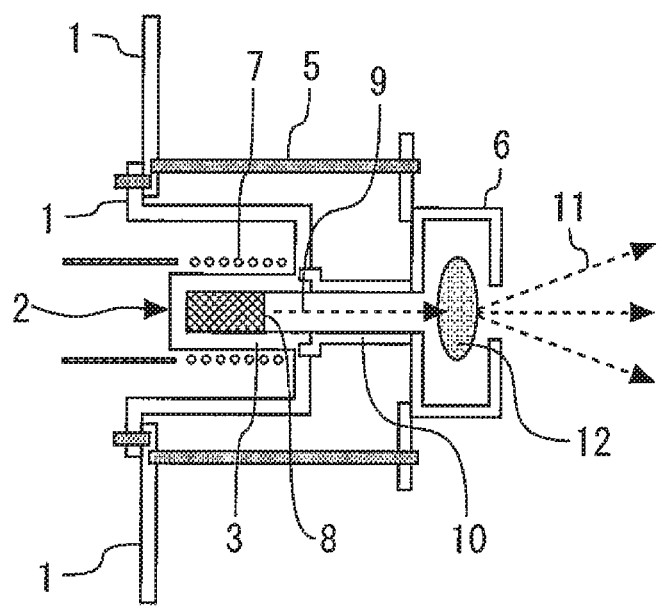
FIG. 2 is a sectional view of an ion implantation apparatus according to the comparative example.

The advantages of the present embodiment will subsequently be described by comparing the embodiment with a comparative example. FIG. 2 is a sectional view of an ion implantation apparatus according to the comparative example. In the comparative example, the solid packed container 3 also serves as the vacuum partition 1 and needs strength. The solid packed container 3 therefore has a shape with an increased wall thickness and has a large heat capacity. As a result, a long time is taken to complete warm up stabilization and the rate of operation is reduced.

On the other hand, in the present embodiment, the solid packed container 3 need not have a pressure partition function and may only have a strength necessary for packing of a solid, since the whole of the solid packed container 3 is disposed in the vacuum inside the vacuum partition 1. The wall thickness of the solid packed container 3 can therefore be reduced to reduce the heat capacity. The amount of heating necessary for sublimation is reduced thereby and a smaller heater 7 suffices. Also, since the solid packed container 3 is supported and fixed on the vacuum partition 1, the gas supply nozzle 10 need not have the function of supporting the solid packed container 3. The wall thickness of the gas supply nozzle 10 can therefore be reduced and the inflow of heat from the arc chamber 6 into the solid packed container 3 can be reduced. Further, since the thermal conductivity of the supporting part 4 is lower than those of the vacuum partition 1 and the solid packed container 3, the amount of heat escaping from the solid packed container 3 through the supporting part 4 can also be reduced. As a result, the time taken to stabilize a sublimation temperature in a range of low sublimation temperatures from 80 to 90° C. in the vacuum is reduced, thus enabling the state f the ion beam to be stabilized faster and increasing the rate of operation.

More specifically, the material of the supporting part 4 is a machinable ceramic material having a thermal conductivity of 2 W/m·k or lower or an engineering plastic having a thermal conductivity of 1 W/m·k or lower. If the supporting part 4 is made of such a material, its thermal conductivity s sufficiently lower than those of the vacuum partition 1 and the solid packed container 3 made of metals.

Embodiment 2

Figure 3:
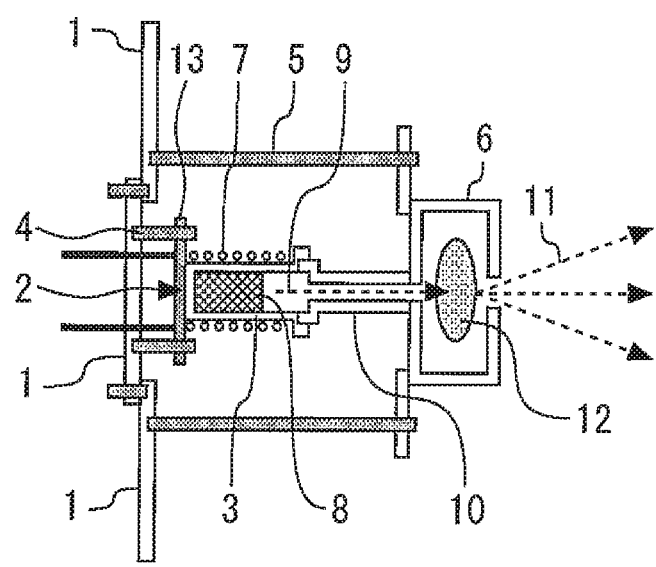
FIG. 3 is a sectional view of an ion implantation apparatus according to Embodiment 2 of the present invention.

FIG. 3 is a sectional view of an ion implantation apparatus according to Embodiment 2 of the present invention. A bottom plate 13 is jointed to the solid packed container 3. The supporting part 4 supports and fixes the bottom plate 13 on the vacuum partition 1. The thermal conductivity of the bottom plate 13 is lower than those of the vacuum partition 1 and the solid packed container 3.

If the bottom plate 13 is made of a metal, heat transfers to the supporting part 4 through the bottom plate 13, thus leaking. To prevent this, a material of low thermal conductivity is used as the material of the bottom plate 13. More specifically, the material of the bottom plate 13 is a machinable ceramic material having a thermal conductivity of 2 W/m·k or lower or an engineering plastic having a thermal conductivity of 1 W/m·k or lower. If the bottom plate 13 is made of such a material, its thermal conductivity is sufficiently lower than those of the vacuum partition 1 and the solid packed container 3 made of metals.

REFERENCE SIGNS LIST 1 vacuum partition; 3 solid packed container; 4 supporting part; 6 arc chamber; 7 heater; 8 aluminum chloride (solid-state material); 9 aluminum chloride gas (source gas); 10 gas supply nozzle; 11 ion beam; 13 bottom plate

The invention claimed is:
1. An ion implantation apparatus comprising:
a vacuum partition inside which a vacuum is maintained;
a solid packed container in which a solid-state material is packed;
a heater sublimating the solid-state material packed in the solid packed container to generate a source gas;
an arc chamber ionizing the source gas and emitting an ion beam of the ionized source gas;
a gas supply nozzle leading the source gas from the solid packed container into the arc chamber; and
a supporting part supporting and fixing the solid packed container on the vacuum partition,
wherein the whole of the solid packed container is disposed inside the vacuum partition, and a thermal conductivity of the supporting part is lower than thermal conductivities of the vacuum partition and the solid packed container.

2. The ion implantation apparatus according to claim 1, wherein the supporting part is made of a machinable ceramic material having a thermal conductivity of 2 W/m·k or lower or an engineering plastic having a thermal conductivity of 1 W/m·k or lower, and
the thermal conductivities of the vacuum partition and the solid packed container are each greater than 2 W/m·k.

3. The ion implantation apparatus according to claim 1, further comprising a bottom plate jointed to the solid packed container,
wherein the supporting part supports and fixes the bottom plate on the vacuum partition, and
a thermal conductivity of the bottom plate is lower than the thermal conductivities of the vacuum partition and the solid packed container.

4. The ion implantation apparatus according to claim 3, wherein the bottom plate is made of a machinable ceramic material having a thermal conductivity of 2 W/m·k or lower or an engineering plastic having a thermal conductivity of 1 W/m·k or lower.

5. The ion implantation apparatus according to claim 1, wherein
the ion beam of the ionized source gas is emitted onto a SiC wafer.

6. The ion implantation apparatus according to claim 1, wherein
the solid-state material is aluminum chloride.

7. The ion implantation apparatus according to claim 1, wherein
the whole of the supporting part is disposed inside the vacuum partition.

8. The ion implantation apparatus according to claim 1, wherein a wall thickness of the solid packed container is thinner than a wall thickness of the vacuum partition.

* * * * *